(12) United States Patent
Hamada et al.

(10) Patent No.: US 10,707,189 B2
(45) Date of Patent: Jul. 7, 2020

(54) LIGHT-EMITTING DEVICE

(71) Applicants: CITIZEN ELECTRONICS CO., LTD., Fujiyoshida-shi, Yamanashi (JP); CITIZEN WATCH CO., LTD., Tokyo (JP)

(72) Inventors: Masahiko Hamada, Fujiyoshida (JP); Hirohiko Ishii, Fujiyoshida (JP)

(73) Assignees: Citizen Electronics Co., Ltd., Yamanashi (JP); Citizen Watch Co., Ltd., Tokyo (JP)

( * ) Notice: Subject to any disclaimer, the term of this patent is extended or adjusted under 35 U.S.C. 154(b) by 0 days.

(21) Appl. No.: 15/760,785

(22) PCT Filed: Sep. 20, 2016

(86) PCT No.: PCT/JP2016/077736
§ 371 (c)(1),
(2) Date: Mar. 16, 2018

(87) PCT Pub. No.: WO2017/047815
PCT Pub. Date: Mar. 23, 2017

(65) Prior Publication Data
US 2018/0254263 A1    Sep. 6, 2018

(30) Foreign Application Priority Data
Sep. 18, 2015 (JP) ................... 2015-185976

(51) Int. Cl.
*H01L 25/075* (2006.01)
*G02B 5/02* (2006.01)
(Continued)

(52) U.S. Cl.
CPC ............ *H01L 25/0753* (2013.01); *G02B 5/02* (2013.01); *H01L 33/483* (2013.01); *H01L 33/52* (2013.01);
(Continued)

(58) Field of Classification Search
CPC . H01L 25/0753; H01L 33/483; H01L 33/505; H01L 33/507; H01L 33/52; H01L 33/60
(Continued)

(56) References Cited

U.S. PATENT DOCUMENTS 7,365,485 B2  4/2008 Fukasawa et al.
7,491,977 B2  2/2009 Fukasawa
(Continued)

FOREIGN PATENT DOCUMENTS

CN    101937911 A    1/2011
CN    102593115 A *  7/2012
(Continued)

OTHER PUBLICATIONS

Machine Translation of CN 102593115 A.*
(Continued)

*Primary Examiner* — Lynne A Gurley
*Assistant Examiner* — Vernon P Webb
(74) *Attorney, Agent, or Firm* — RatnerPrestia

(57) ABSTRACT

A light-emitting device is provided whose color mixing property and light emission efficiency are improved, while white light with high color rendering performance is ensured by means of four kinds of LED elements emitting red, green, blue, and white light respectively. The light-emitting device includes a phosphor layer containing a phosphor, a first LED element to emit white light in combination with fluorescence generated by excitation of the phosphor, a second LED element to emit red light, a third LED element to emit green light, a fourth LED element to emit blue light placed more distant from the phosphor layer compared to the second and third LED elements, a substrate with the first to fourth LED elements mounted on a common mounting surface, a resin frame surrounding at least a part of an outer circumference of the substrate, a sealing resin injected inside the resin
(Continued)

frame and on the substrate to encapsulate the first to fourth LED elements, and a light-shielding component placed on an upper surface of the sealing resin to cover at least the first LED element.

8 Claims, 18 Drawing Sheets

(51) Int. Cl.
    *H01L 33/52*     (2010.01)
    *H01L 33/56*     (2010.01)
    *H01L 33/60*     (2010.01)
    *H01L 33/48*     (2010.01)
    *H01L 33/50*     (2010.01)

(52) U.S. Cl.
    CPC .......... *H01L 33/505* (2013.01); *H01L 33/507* (2013.01); *H01L 33/56* (2013.01); *H01L 33/60* (2013.01); *H01L 2933/005* (2013.01); *H01L 2933/0033* (2013.01); *H01L 2933/0041* (2013.01); *H01L 2933/0091* (2013.01)

(58) Field of Classification Search
    USPC ...................................... 257/89–94, 100–106
    See application file for complete search history.

(56) References Cited

U.S. PATENT DOCUMENTS

| | | | |
|---|---|---|---|
| 8,981,415 | B1 | 3/2015 | Hsu et al. |
| 2003/0214725 | A1 | 11/2003 | Akiyama |
| 2004/0188700 | A1 | 9/2004 | Fukasawa et al. |
| 2006/0245188 | A1 | 11/2006 | Takenaka |
| 2012/0014091 | A1 | 1/2012 | He et al. |
| 2015/0155460 | A1 | 6/2015 | Fukasawa |

FOREIGN PATENT DOCUMENTS

| | | | |
|---|---|---|---|
| CN | 102593115 A | | 7/2012 |
| CN | 204361094 U | | 5/2015 |
| CN | 107039410 A | * | 8/2017 |
| JP | 2001024238 A | | 1/2001 |
| JP | 2004004626 A | | 1/2004 |
| JP | 2005123484 A | | 5/2005 |
| JP | 2005223082 A | | 8/2005 |
| JP | 2006310613 A | | 11/2006 |
| JP | 2008288412 A | | 11/2007 |
| JP | 2009246353 A | | 10/2009 |
| JP | 2011192738 A | | 9/2011 |
| KR | 20150044307 A | | 4/2015 |
| WO | 2012046661 A1 | | 4/2012 |

OTHER PUBLICATIONS

Chinese Office Action for Chinese Application No. 201680048422.3, dated Mar. 4, 2019, with translation, 12 pages.
English translation of the Written Opinion for International Application No. PCT/JP2016/077736, dated Nov. 1, 2016, 8 pages.
International Search Report and Written Opinion for International Application No. PCT/JP2016/077736, dated Nov. 1, 2016, 6 pages.
Indian First Examination Report for Indian Application No. 201817002633, dated Sep. 27, 2019 with translation, 9 pages.

* cited by examiner

FIG. 4
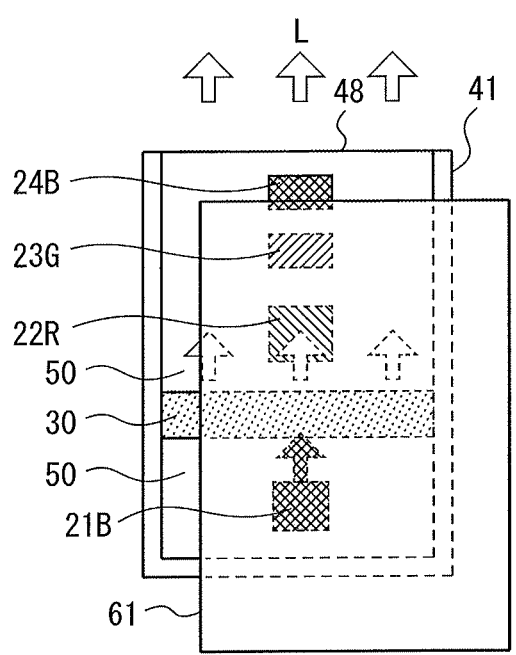
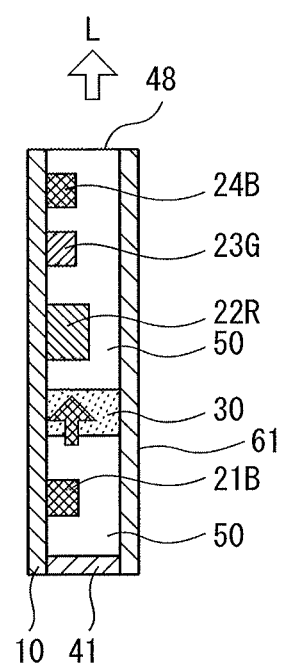

FIG 11
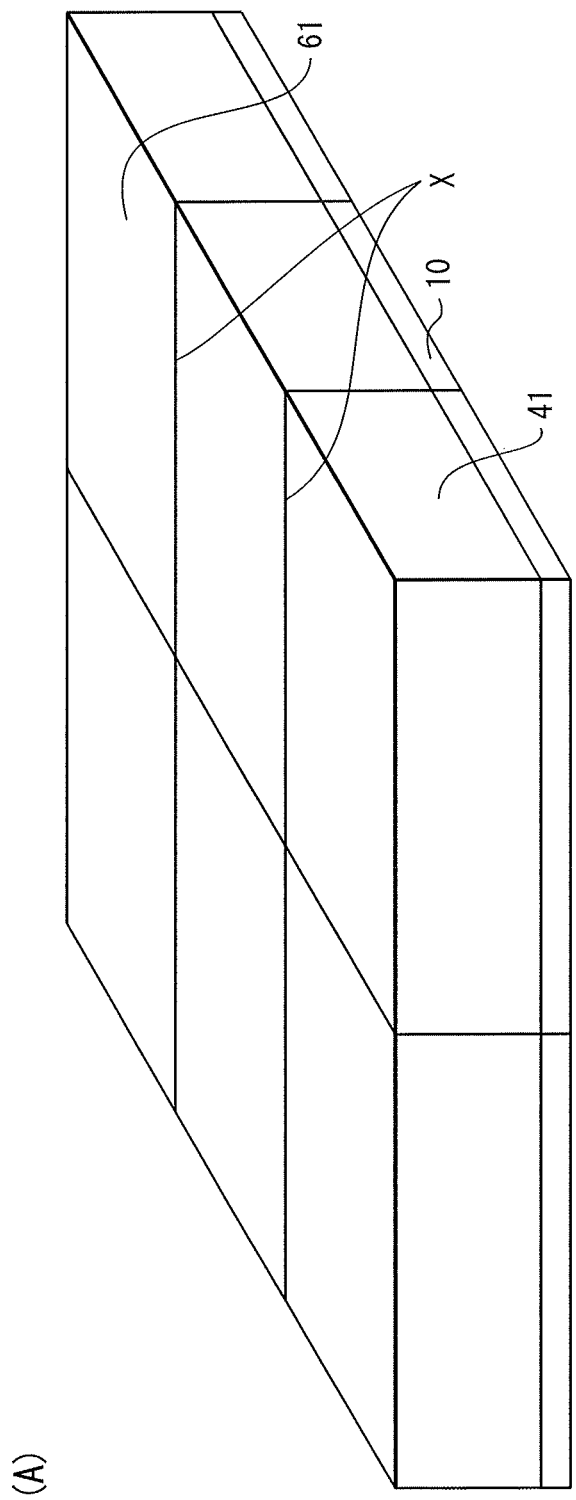
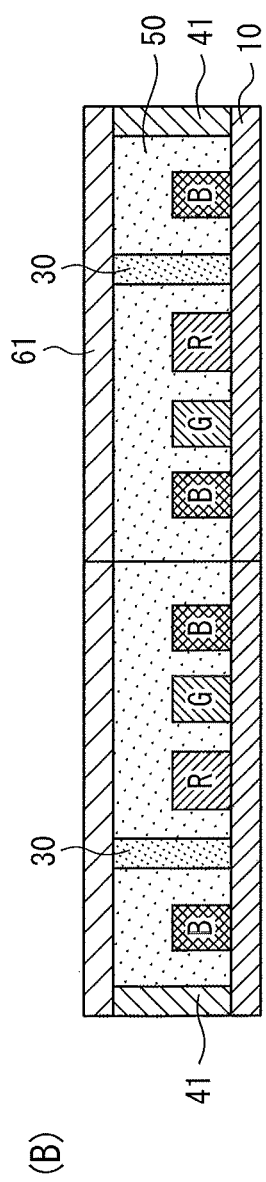

FIG. 14
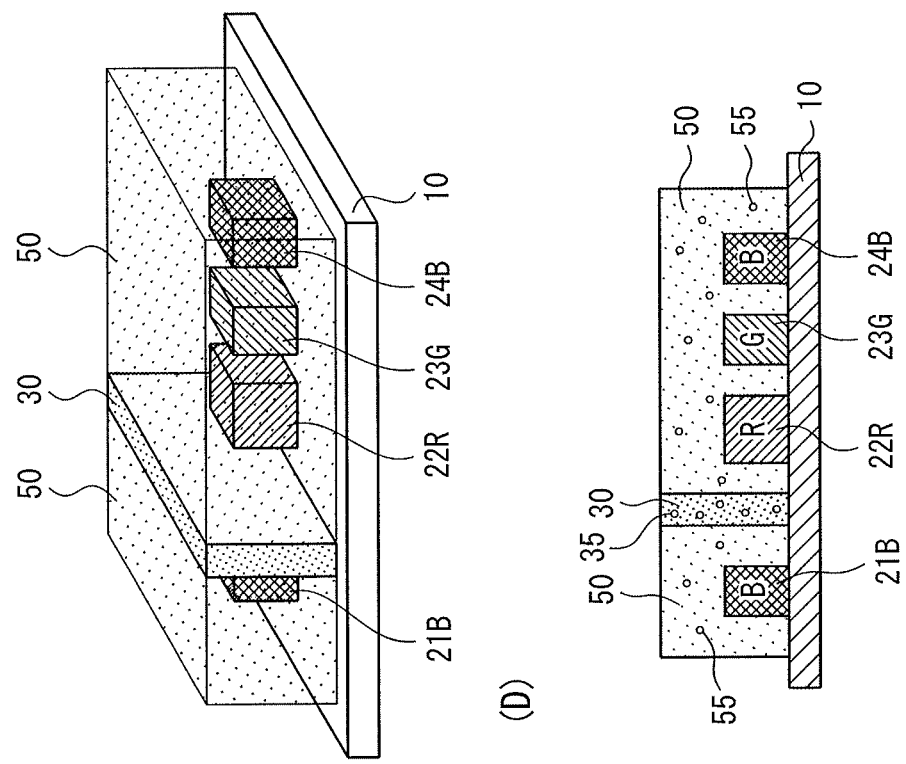
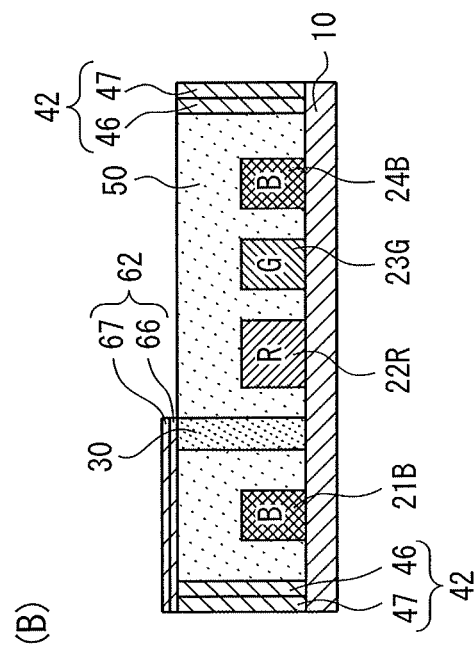

LIGHT-EMITTING DEVICE

CROSS REFERENCE TO RELATED APPLICATIONS

This is the U.S. National Phase application of PCT/JP2016/077736, filed Sep. 20, 2016, which claims priority to Japanese Patent Application No. 2015-185976, filed Sep. 18, 2015, the disclosures of these applications being incorporated herein by reference in their entireties for all purposes.

TECHNICAL FIELD OF THE INVENTION

The present invention relates to a light-emitting device.

BACKGROUND OF THE INVENTION

Patent Literature 1 describes a light emitting diode chip provided with a green light-emitting element, a blue light-emitting element, and a red light-emitting element which are mounted as light emitters on a chip substrate, a reflection frame which is placed on the chip substrate so as to surround the light emitters and has an aperture at a part of an upper surface and a side wall, a reflection surface which is formed on an inner circumferential surface of a side wall of the reflection frame, an optically transparent resin body which is formed in the reflection frame and has a light outgoing surface at the aperture on the side wall, and a reflection film which covers the optically transparent resin body exposed at an upper surface of the reflection frame.

Patent Literature 2 describes an LED low backlight source device having a red LED element, a green LED element, and a blue LED element as well as a reflection cover for reflecting light emitted from the LEDs without leaking outside, and emitting the light in the direction nearly parallel to the mounting surface of the LEDs.

Patent Literature 3 describes an LED light-emitting device in which a red LED, a green LED, and blue LED, as well as a white LED configured with a blue LED covered with a resin blended with a phosphor are mounted at a different height on a mount board.

Patent Literature 4 describes a white LED, which has a long-wavelength blue LED element encapsulated with an encapsulant containing a phosphor to emit a yellow excitation light and a red LED element having an upper part covered with a light-shielding coating, and emits as a whole white illumination light outward.

PATENT LITERATURE

Patent literature 1: Japanese Unexamined Patent Publication (Kokai) No. 2005-223082
Patent Literature 2: Japanese Unexamined Patent Publication (Kokai) No. 2009-246353
Patent Literature 3: Japanese Unexamined Patent Publication (Kokai) No. 2008-288412
Patent Literature 4: Japanese Unexamined Patent Publication (Kokai) No. 2005-123484

SUMMARY OF INVENTION

When three kinds of LED elements which emit red light, green light, and blue light respectively are activated at the same time, white light is obtained. However the above is inadequate as a white light source in terms of color rendering property, and the control of electric currents for adjusting a hue is complicated. Therefore, it is desirable that another LED element for emitting white light through a phosphor layer containing a phosphor be provided so as to improve the color rendering property using four kinds of LED elements, and also to simplify the control of electric currents for adjusting the hue. However, when an LED element emitting blue light and an LED element emitting white light through a phosphor layer are placed in one package, the phosphor is excited by the blue light to white light and the light quantity of blue light may be reduced. When four kinds of LED elements emitting red light, green light, blue light, and white light respectively are provided, it is difficult to mix the light from these LED elements.

Therefore, an object of the present invention is to provide a light-emitting device whose color mixing property and light emission efficiency are improved, while white light with high color rendering performance is ensured by means of four kinds of LED elements emitting red light, green light, blue light, and white light respectively.

Provided is a light-emitting device including a phosphor layer containing a phosphor, a first LED element to emit white light in combination with fluorescence generated by excitation of the phosphor, a second LED element to emit red light, a third LED element to emit green light placed on a side opposite of the first LED element with respect to the phosphor layer, a fourth LED element to emit blue light placed on the side opposite of the first LED element with respect to the phosphor layer, the fourth LED element being placed more distant from the phosphor layer compared to the second and the third LED elements, a substrate with the first to the fourth LED elements mounted on a common mounting surface, a resin frame surrounding at least a part of an outer circumference of the substrate, a sealing resin injected inside the resin frame and on the substrate to encapsulate the first to the fourth LED elements, and a light-shielding component placed on an upper surface of the sealing resin, which is a surface opposite of the mounting surface, to cover at least the first LED element.

Preferably, in the above light-emitting device, a scattering agent for diffusing light is dispersed in the sealing resin.

Preferably, in the above light-emitting device, the resin frame includes an inner white resin layer for reflecting light toward the sealing resin, and an outer black resin layer for preventing outward light transmission.

Preferably, in the above light-emitting device, the light-shielding component includes an inner white sheet for reflecting light toward the sealing resin, and an outer black sheet for preventing outward light transmission.

Preferably, in the above light-emitting device, the light-shielding component covers the entire upper surface of the sealing resin, the resin frame has a light outgoing port for emission light from the first to the fourth LED elements, and the emission light is emitted from the light outgoing port in a direction parallel to the mounting surface.

Preferably, in the above light-emitting device, the light-shielding component covers the first LED element, the resin frame surrounds the entire outer circumference of the substrate, and emission light from the first to the fourth LED elements is emitted from above the second to the fourth LED elements in a direction perpendicular to the mounting surface.

Preferably, in the above light-emitting device, the first to the fourth LED elements are aligned on the mounting surface in a row and in the mentioned order.

Preferably, in the above light-emitting device, the phosphor layer divides the sealing resin between the first LED element and the second LED element, and the second LED element is placed closer to the first LED element than the phosphor layer.

Preferably, in the above light-emitting device, the second to the fourth LED elements are aligned in a triangular form.

Preferably, in the above light-emitting device, the third and the fourth LED elements are transparent elements allowing the white light and the red light to transmit, and the second LED element is an opaque element not allowing the blue light to transmit.

According to the above light-emitting device, color mixing property and light emission efficiency can be improved, while white light with high color rendering performance is ensured by means of four kinds of LED elements emitting red light, green light, blue light, and white light respectively.

BRIEF DESCRIPTION OF DRAWINGS

FIGS. 4(A) and (B) are figures for illustrating the structure of the light-emitting device 1.

FIGS. 11(A) and (B) are figures illustrating production process steps for the light-emitting device 1.

FIGS. 14(A) to (D) are figures illustrating the structure of a light-emitting device 2.

DETAILED DESCRIPTION OF EMBODIMENTS OF THE INVENTION

Hereinafter, with reference to the accompanying drawings, light-emitting devices will be explained in detail. However, it should be noted that the present invention is not limited to the drawings or the embodiments described below.

Figure 1:
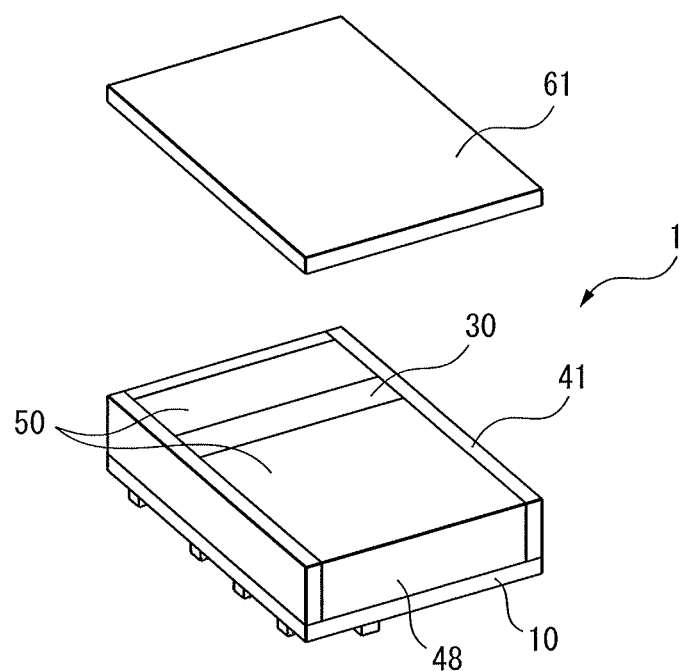
FIG. 1 is a perspective view of a light-emitting device 1.
Figure 2:
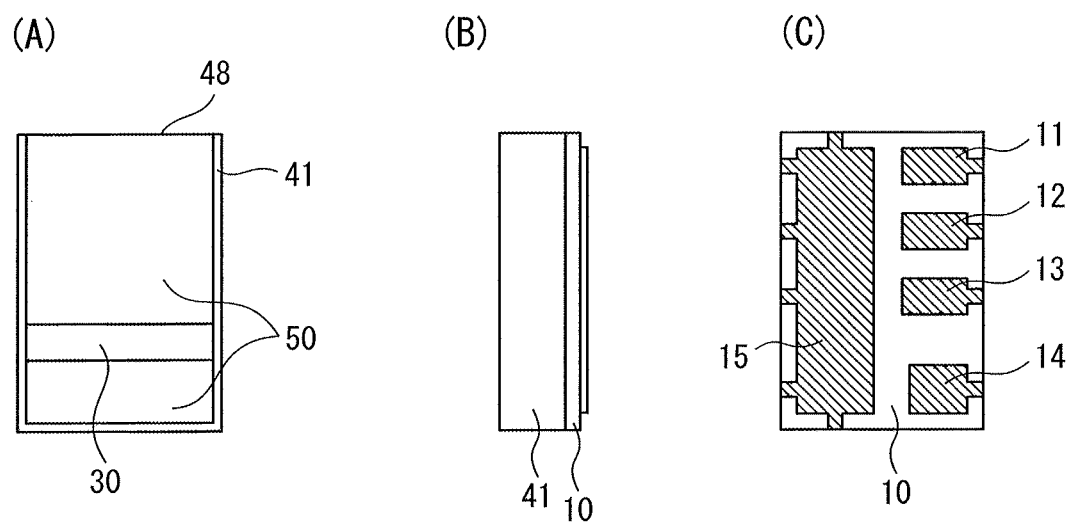
FIGS. 2(A) to (C) are a top view, a side view, and a bottom view of the light-emitting device 1.
Figure 3:
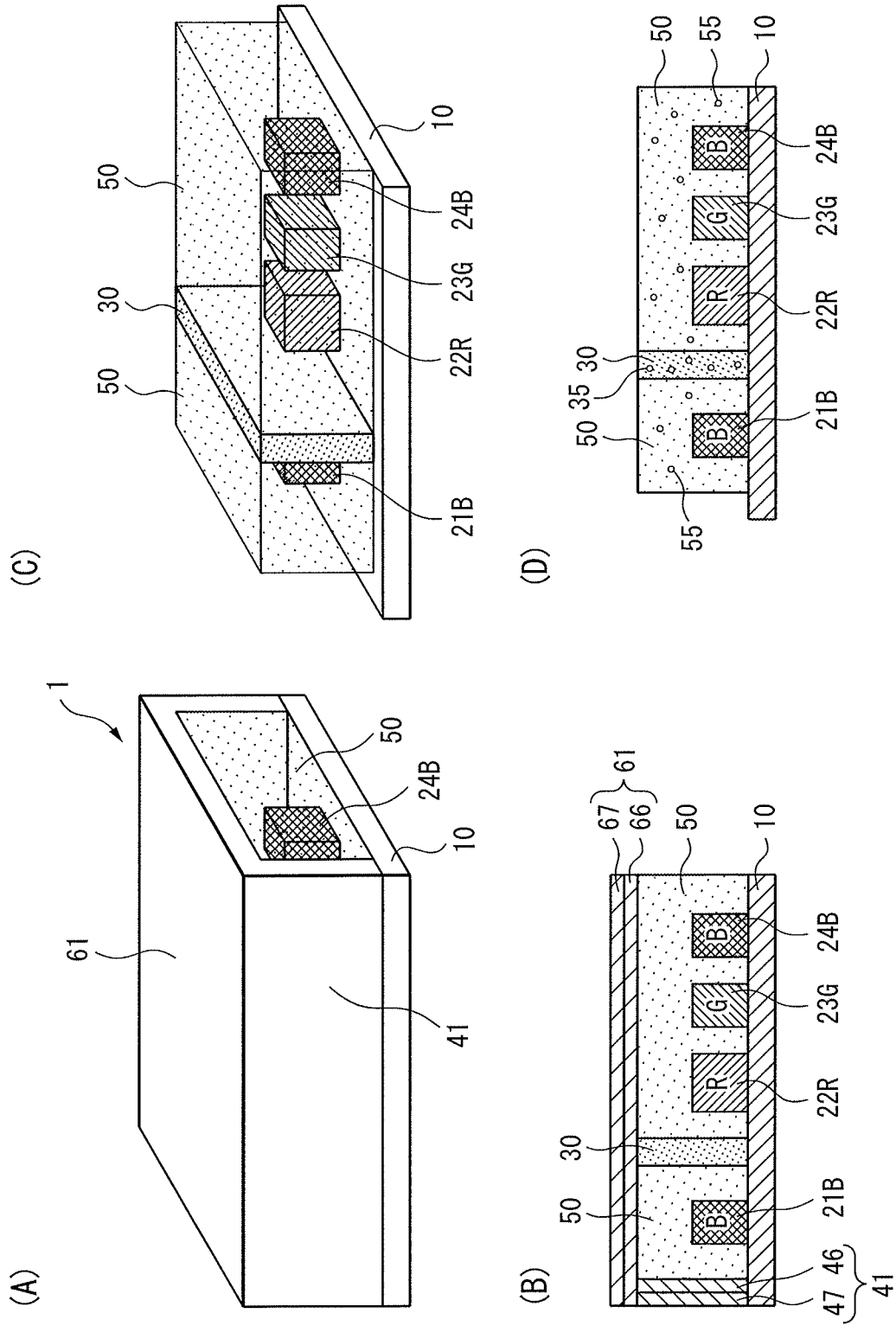
FIGS. 3(A) to (D) are figures for illustrating the structure of the light-emitting device 1.
Figure 5:
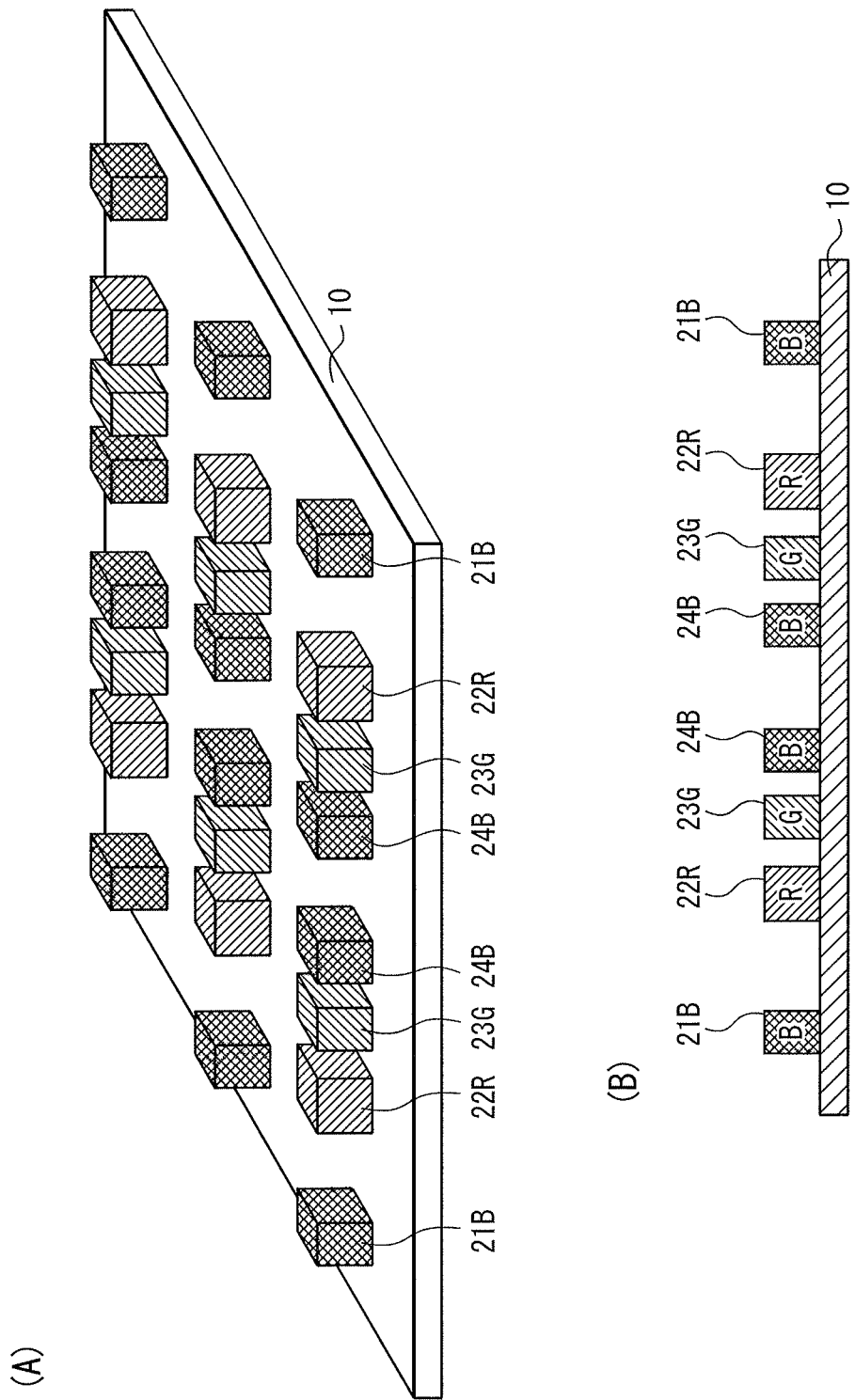
FIGS. 5(A) and (B) are figures illustrating production process steps for the light-emitting device 1.
Figure 6:
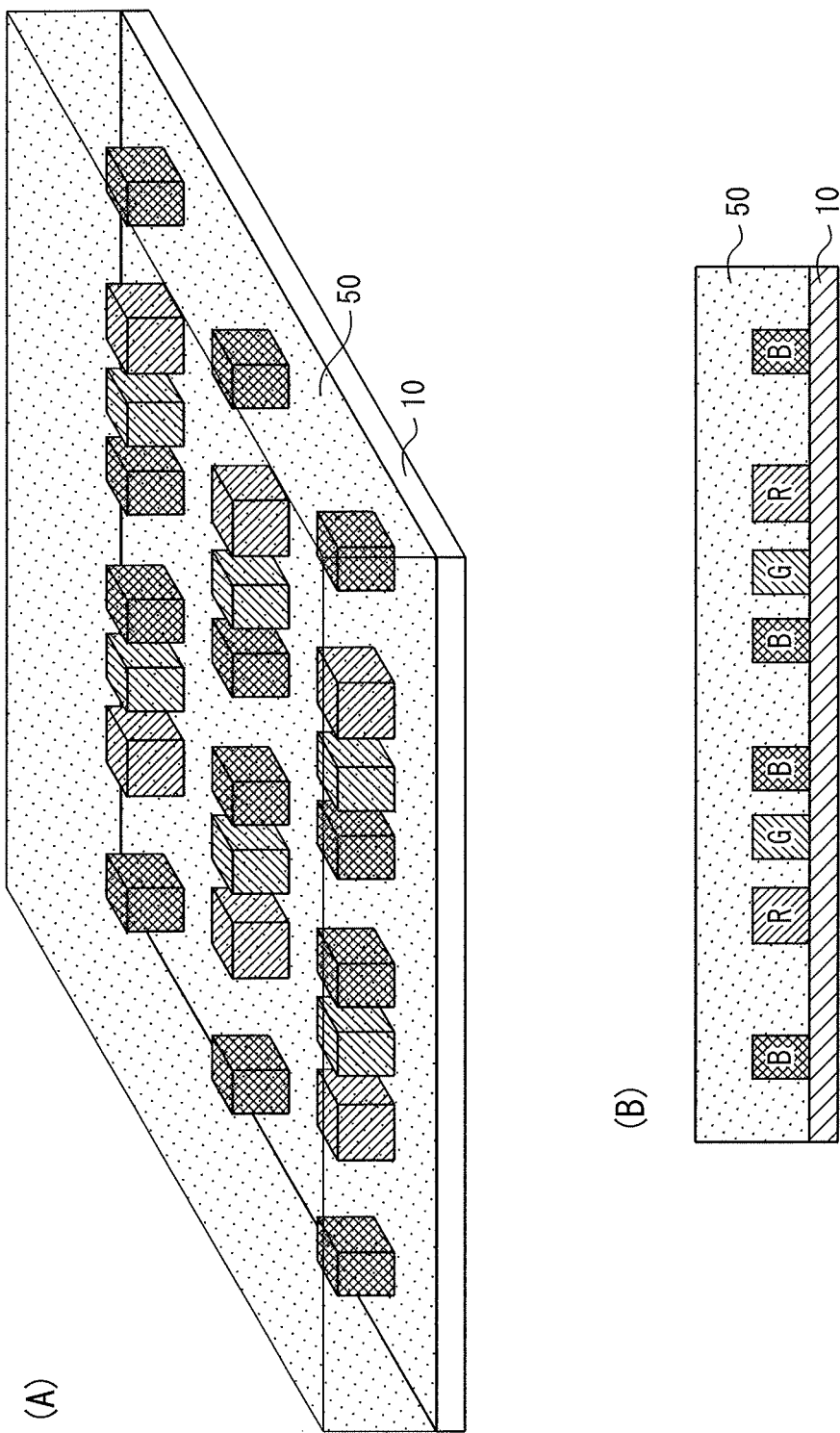
FIGS. 6(A) and (B) are figures illustrating production process steps for the light-emitting device 1.
Figure 7:
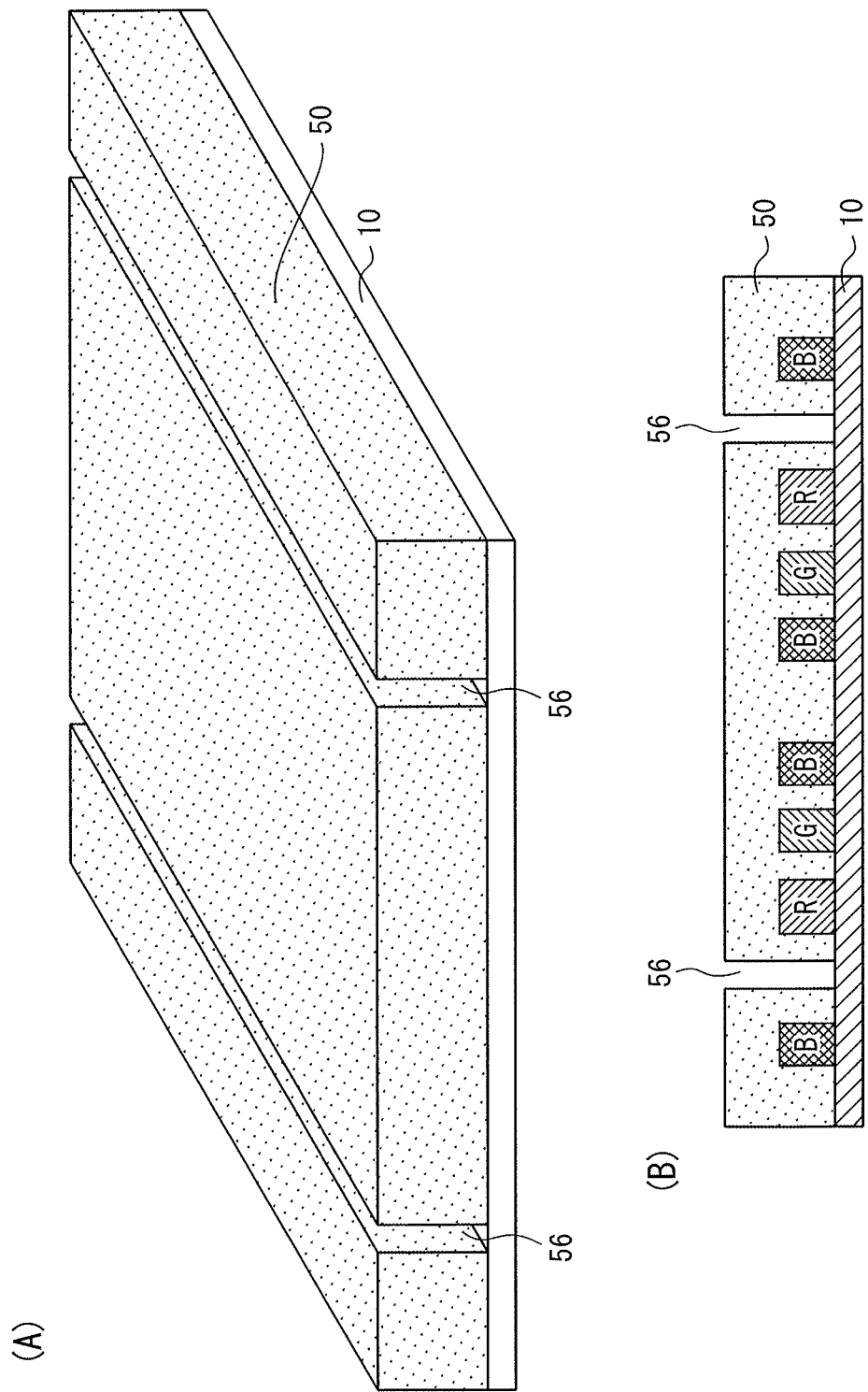
FIGS. 7(A) and (B) are figures illustrating production process steps for the light-emitting device 1.
Figure 8:
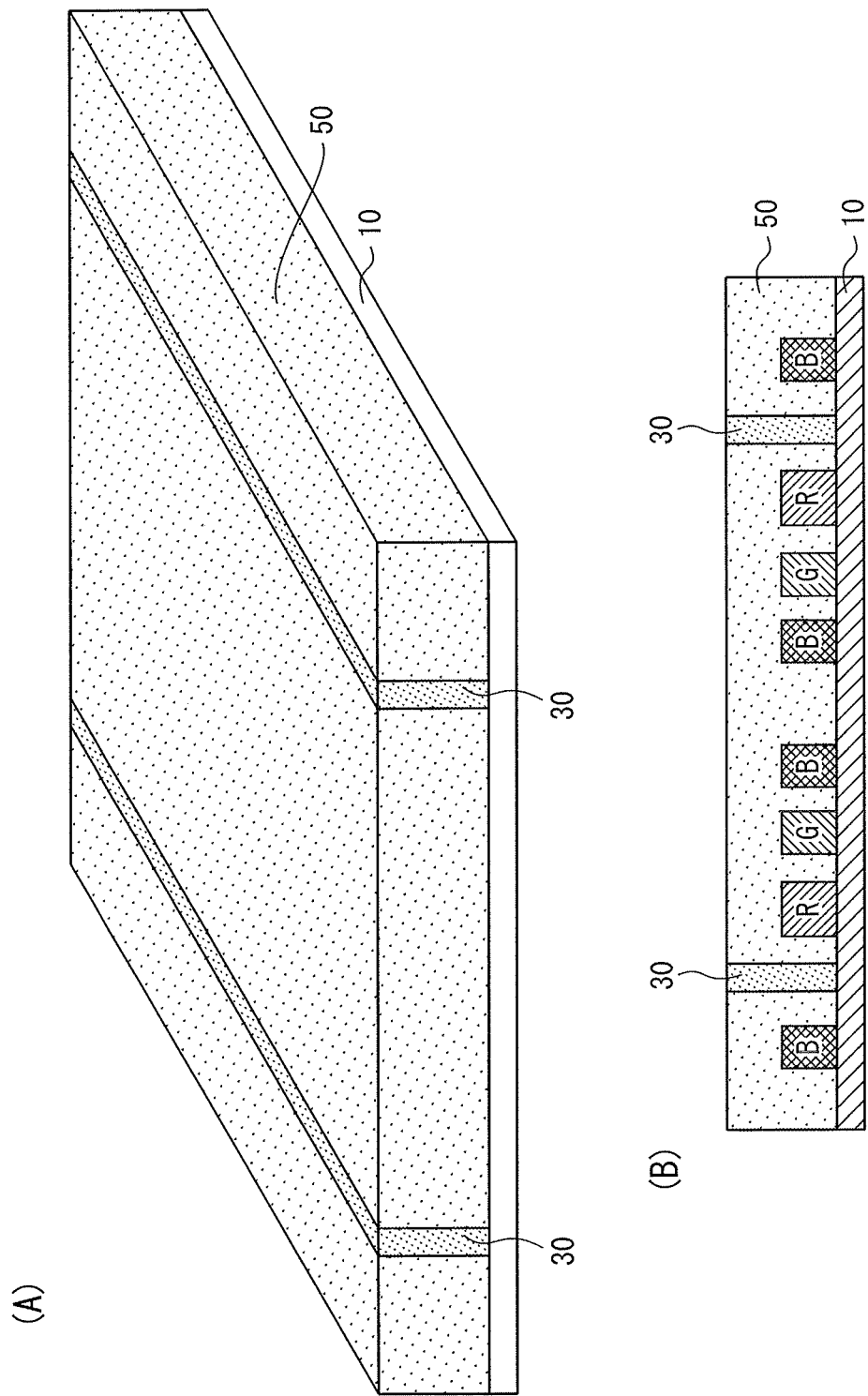
FIGS. 8(A) and (B) are figures illustrating production process steps for the light-emitting device 1.
Figure 9:
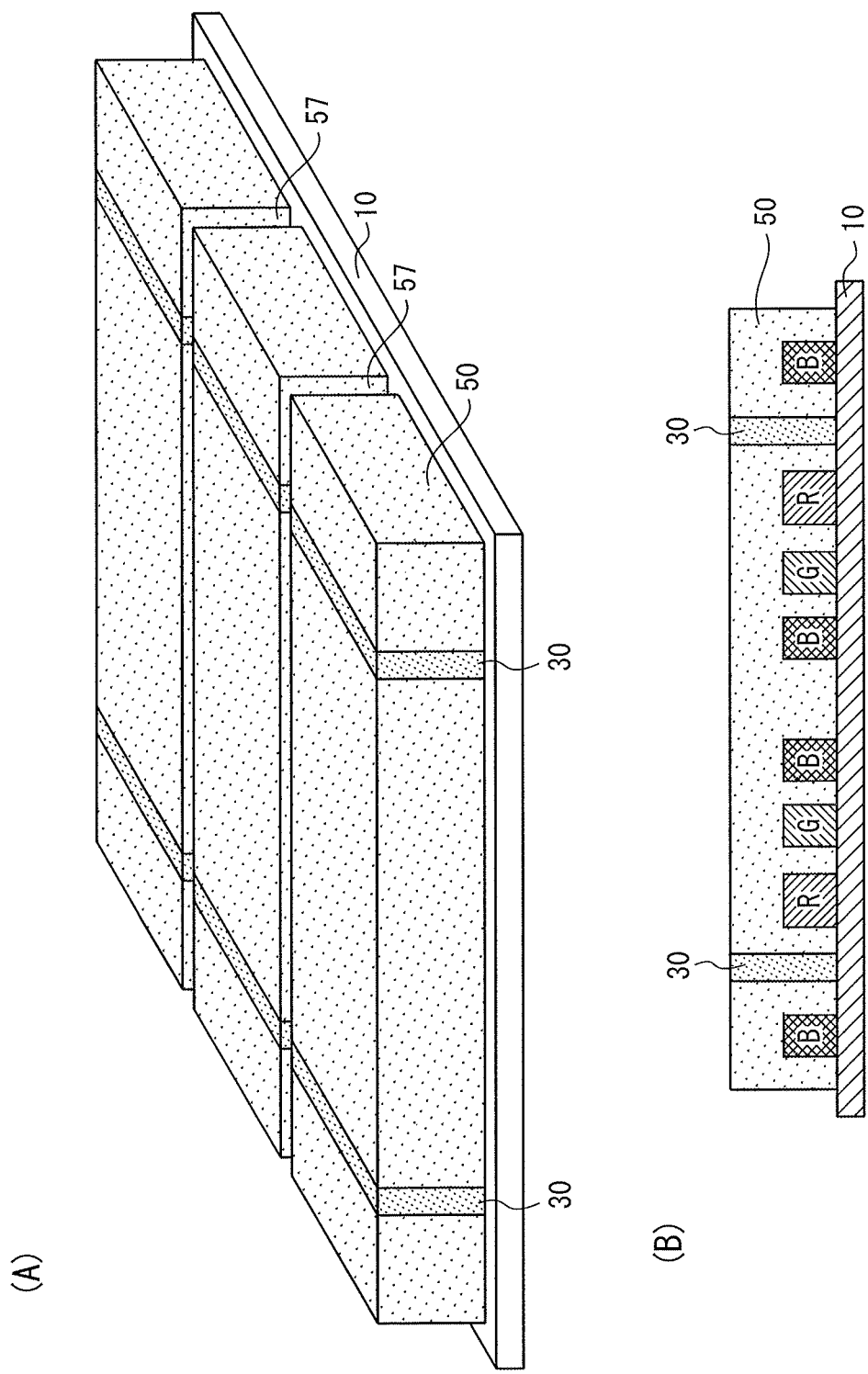
FIGS. 9(A) and (B) are figures illustrating production process steps for the light-emitting device 1.
Figure 10:
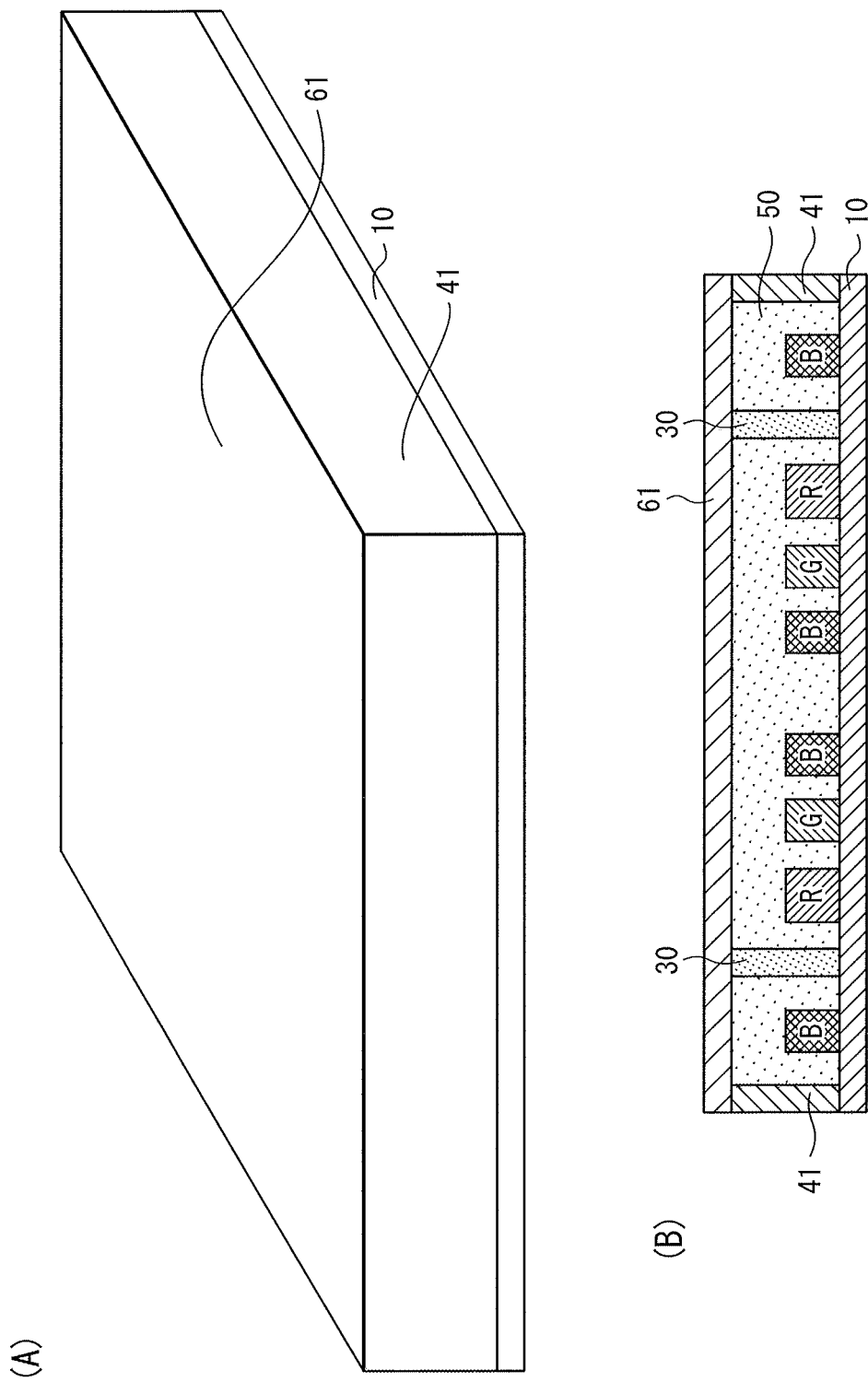
FIGS. 10(A) and (B) are figures illustrating production process steps for the light-emitting device 1.
Figure 12:
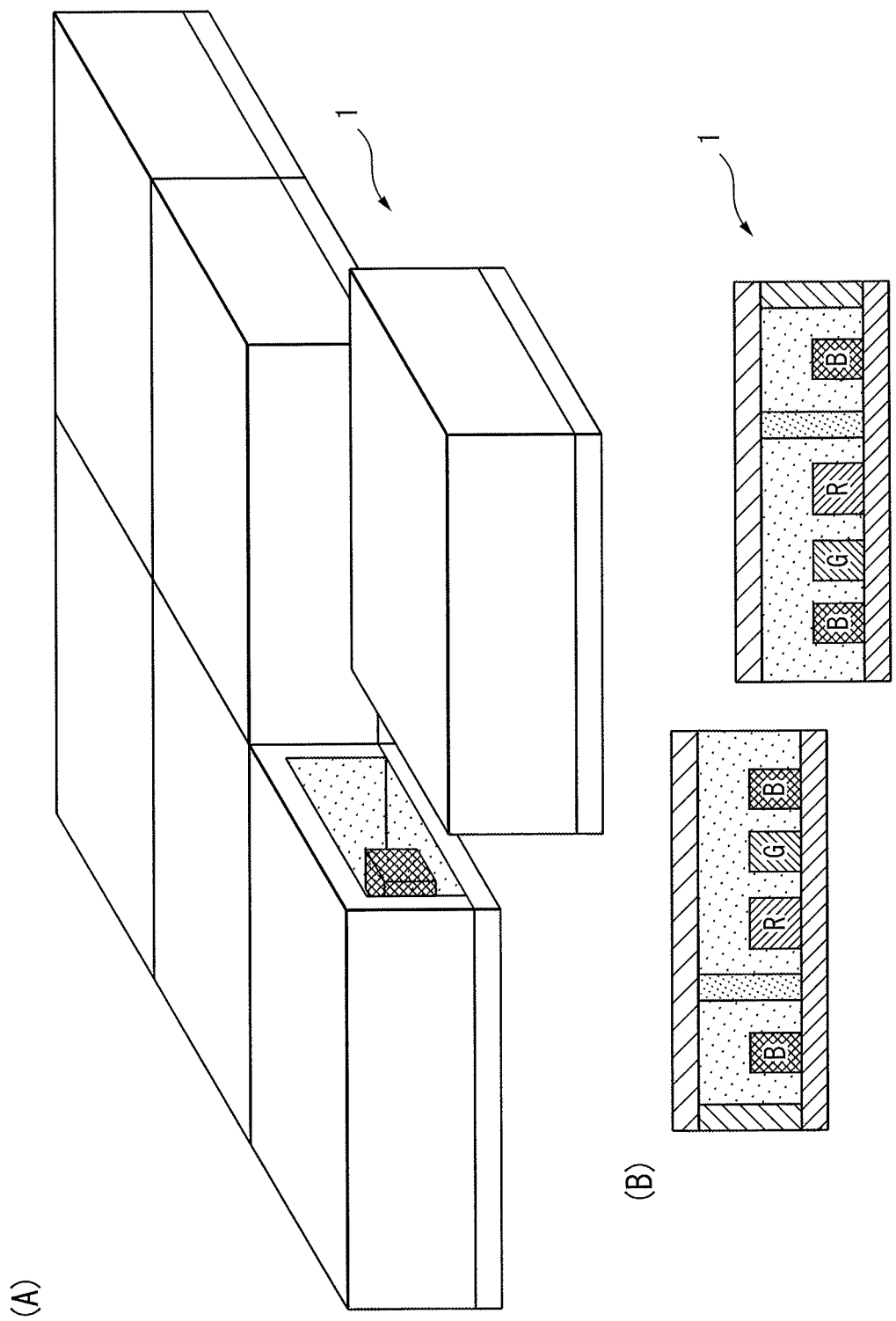
FIGS. 12(A) and (B) are figures illustrating production process steps for the light-emitting device 1.

FIG. 1 is a perspective view of a light-emitting device 1. FIG. 2(A) to FIG. 2(C) are respectively a top view, a side view, and a bottom view of the light-emitting device 1. FIG. 3(A) to FIG. 4(B) are figures for illustrating the structure of the light-emitting device 1.

The light-emitting device 1 has a substrate 10, four LED elements 21B, 22R, 23G, and 24B, a phosphor layer 30, a resin frame 41, a sealing resin 50, and a light-shielding component 61. The light-emitting device 1 accomplishes white light with high color rendering performance by the three LED elements 22R, 23G, and 24B emitting respectively red (R) light, green (G) light, and blue (B) light, as well as the LED element 21B emitting white (W) light using the phosphor layer 30. The three side surfaces and the upper surface of the light-emitting device 1 are covered with the resin frame 41, and the light-shielding component 61. One lateral surface not covered by the resin frame 41 is a light outgoing port 48 of the light-emitting device 1, from which the light-emitting device 1 emits light as denoted by arrows L in FIG. 4(A) and FIG. 4(B). The light-emitting device 1 is a side-emission-type LED package applicable to an illumination light source, or a backlight light source.

Figure 19:
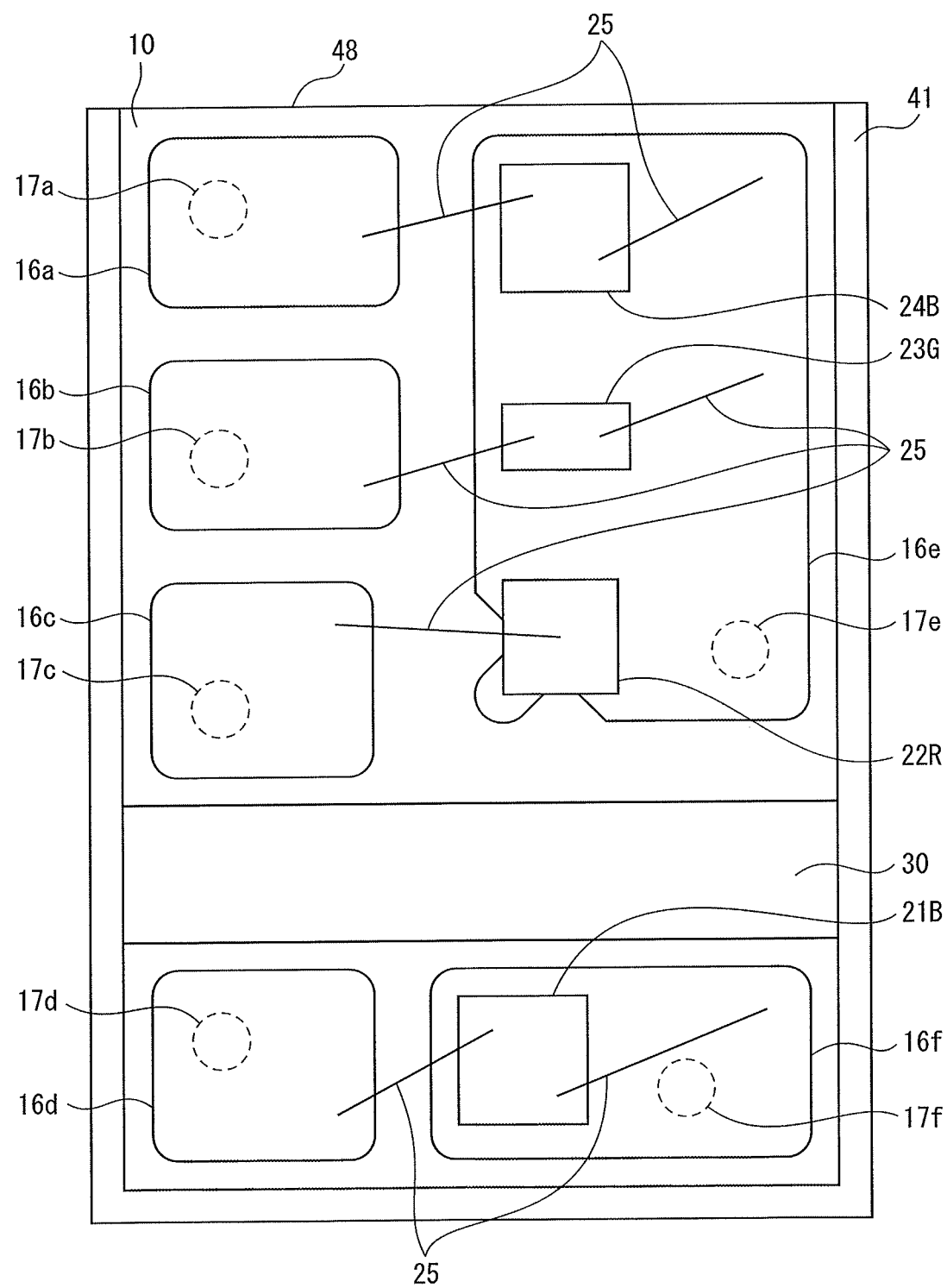
FIG. 19 is a plan view indicating the positions of circuit patterns 16a to 16f, and the LED elements 21B, 22R, 23G, and 24B on the substrate 10.

FIG. 1 illustrates the light-emitting device 1 from which the light-shielding component 61 is removed. In FIG. 1 and FIG. 2(A), depiction of the LED elements 21B, 22R, 23G, and 24B is omitted. FIG. 3(A) is a perspective view depicting the light-emitting device 1 attached with the resin frame 41 and the light-shielding component 61, and FIG. 3(B) is a longitudinal sectional view of FIG. 3(A). FIG. 3(C) is a perspective view depicting the light-emitting device 1 from which the resin frame 41 and the light-shielding component 61 are removed, and FIG. 3(D) is a longitudinal sectional view of FIG. 3(C). FIG. 4(A) is a top view of the light-emitting device 1 from which the light-shielding component 61 is removed, and FIG. 4(B) is a longitudinal sectional view of FIG. 4(A). FIG. 19 is a plan view indicating the positions of circuit patterns 16a to 16f, and the LED elements 21B, 22R, 23G, and 24B on the substrate 10.

The substrate 10 is an insulating substrate, such as a glass epoxy substrate, a BT resin substrate, a ceramic substrate, and a metal core substrate, on the same mounting surface of which, namely on the upper surface, the LED elements 21B, 22R, 23G, and 24B are mounted. As depicted in FIG. 2(C), on the bottom face of the substrate 10, five electrodes 11 to 15 for supplying electric power to the LED elements 21B, 22R, 23G, and 24B are placed. Further, as depicted in FIG. 19, on the upper surface of the substrate 10 nearly rectangular circuit patterns 16a to 16d are provided at the positions corresponding to the respective electrodes 11 to 14 on the bottom face, and two nearly rectangular circuit patterns 16e, 16f are provided at the positions corresponding to the electrode 15 on the bottom face. The circuit patterns 16a to 16c, and 16e are positioned closer to the light outgoing port 48 than the phosphor layer 30, and the circuit patterns 16d, 16f are positioned further from the light outgoing port 48 than the phosphor layer 30.

The electrodes 11 to 14 and the circuit patterns 16a to 16d are electrically connected respectively through-hole electrodes 17a to 17d, and the electrode 15 and the circuit patterns 16e, 16f are electrically connected respectively via through-hole electrodes 17e, 17f. For example, the electrodes 11 to 14 are anode electrodes corresponding respectively to the LED elements 21B, 22R, 23G, and 24B, and the electrode 15 is a cathode electrode common to the LED elements 21B, 22R, 23G, and 24B. Alternatively, on the substrate 10, four cathode electrodes corresponding to the four LED elements respectively and an anode electrode common to the four LED elements may be provided. Alternatively, each of the LED elements 21B, 22R, 23G, and 24B may be provided with two electrodes, and thus eight electrodes may be provided in total.

Electrodes (element electrodes) of the LED elements 21B, 22R, 23G, and 24B are electrically connected to the circuit patterns 16a to 16f via an electroconductive adhesive material such as a Ag paste, or wires of wire bonding. Specifically, as depicted in FIG. 19, the LED element 21B is mounted on the circuit pattern 16f, and the element electrodes thereof are connected to the circuit patterns 16d, 16f via wires 25. The LED element 22R is mounted on the circuit pattern 16e, and one of the element electrodes thereof is connected to the circuit pattern 16c via a wire 25. The LED element 23G is mounted on the circuit pattern 16e, and the element electrodes thereof are connected to the circuit patterns 16b, 16e via wires 25. The LED element 24B is mounted on the circuit pattern 16e, and the element electrodes thereof are connected to the circuit patterns 16a, 16e via wires 25.

The LED element 21B is an example of the first LED element, and is a blue LED element to emit blue light with an emission wavelength band of, for example, approximately 450 to 460 nm. The phosphor layer 30 is, as depicted in FIG. 3(D), a resin layer containing a phosphor 35, and is provided such that the same divides the sealing resin 50 into two parts between the LED element 21B and the LED element 22R. As the phosphor 35, for example, a yellow phosphor, such as yttrium aluminum garnet (YAG), is used. The LED element 21B emits white light by a combination of blue light and yellow light generated by excitation of the yellow phosphor in the phosphor layer 30 with the blue light.

In this regard, the phosphor layer 30 may contain more than one kind of phosphors, such as a green phosphor and a red phosphor in place of the yellow phosphor. The green phosphor is for example a particulate fluorescent material such as $(BaSr)_2SiO_4:Eu^{2+}$, which absorbs blue light emitted by the LED element 21B and converts the wavelength thereof to that of green light. The red phosphor is for example a particulate fluorescent material such as $CaAlSiN_3:Eu^{2+}$, which absorbs blue light emitted by the LED element 21B and converts the wavelength thereof to that of red light. In this case, the LED element 21B emits white light obtained by mixing the blue light with green light and red light obtained by excitation of the green phosphor and the red phosphor with the blue light.

Alternatively, for example, a blue LED element which has an upper surface and side surfaces covered with a resin layer containing a yellow phosphor and emits white light singly may be mounted as the first LED element and the phosphor layer, in place of the LED element 21B and the phosphor layer 30.

The LED element 22R is an example of the second LED element, and is, for example, a red LED element to emit red light with an emission wavelength band of approximately 620 to 660 nm. The LED element 23G is an example of the third LED element, and is, for example, a green LED element to emit green light with an emission wavelength band of approximately 510 to 530 nm. The LED element 24B is an example of the fourth LED element, and is, for example, similar to the LED element 21B a blue LED element to emit blue light with an emission wavelength band of approximately 450 to 460 nm. In this regard, the LED elements 21B, 24B may have the same or different characteristics.

Since the light-emitting device 1 is provided with the electrode 15 and the electrodes 11 to 14 corresponding respectively to the LED elements 21B, 22R, 23G, and 24B, the four LED elements can be driven independently. When a hue is to be adjusted with only three LED elements of RGB, the regulation of each current value of the LED elements is complicated. However, the light-emitting device 1 additionally includes the white (W) LED element 21B, and therefore a hue may be adjusted based on the white light by actuating both one of the LED elements 22R, 23G, and 24B, and the LED element 21B to emit light. For example, by actuating both the LED elements 21B, 22R to emit light, white light tinged with red can be obtained easily, and by actuating both the LED elements 21B, 24B to emit light, white light tinged with blue can be obtained easily. Therefore, the regulation of current values of LED elements can be simplified.

Since blue light excites a yellow phosphor, when a simplex blue LED element is mounted near a white LED element which emits white light using a yellow phosphor, there is a risk that the emission light of the blue LED element may excite the yellow phosphor and be converted to white light, and eventually the light quantity of blue light may be decreased. Further, since green light also excites a yellow phosphor slightly, when a green LED element is mounted near a white LED element, the light quantity of green light may also be decreased. On the other hand, since red light does not excite a yellow phosphor, even when a red LED element is mounted near a white LED element, the light quantity of red light is not decreased. Therefore, when blue, green, red, and white LED elements are mounted on the same substrate, it is necessary to place the blue LED element apart from the phosphor layer of the white LED element; further, it is preferable to place also the green LED element apart from the phosphor layer of the white LED element to the extent possible; however the red LED element may be placed at any position.

Consequently, in the light-emitting device 1, the LED elements 22R, 23G, and 24B are mounted in a row, closer to the light outgoing port 48 than the phosphor layer 30, and frontwards on the light emission path (optical path) of the LED element 21B, such that the LED element 24B is positioned most apart from the phosphor layer 30 and the LED element 22R is closest to the phosphor layer 30. In other words, the LED element 24B is placed on a side opposite of the LED element 21B with respect to the phosphor layer 30, and more distant from the phosphor layer 30 compared to the LED elements 22R, 23G, such that the LED elements 21B, 22R, 23G, and 24B are aligned on the mounting surface of the substrate 10 in a row and in the mentioned order.

The LED elements 23G, 24B are preferably transparent elements constituted, for example, based on sapphire. When the LED elements 23G, 24B are transparent elements to transmit white light and red light, even if the LED elements 22R, 23G, and 24B are mounted in a straight row toward the light outgoing port 48, for example, red light from the LED element 22R is not blocked by the LED elements 23G, 24B, and therefore the color mixing property may be enhanced. Further, the LED element 22R is preferably an opaque element. When the LED element 22R is an opaque element not transmitting blue light, blue light emitted from the LED element 24B toward the phosphor layer 30 is blocked by the LED element 22R, so that excitation light is not generated unnecessarily from the phosphor layer 30.

The resin frame 41 is a resin-made component that surrounds three sides of the outer circumference of the substrate 10 excluding one side where the light outgoing port 48 of the light-emitting device 1 is present. The resin frame 41 has the light outgoing port 48 for emission light from the LED elements 21B, 22R, 23G, and 24B, and the emission light is emitted from the light outgoing port 48 in a direction parallel to the mounting surface of the substrate 10.

As depicted in FIG. 3(B), the resin frame 41 has preferably a two-layer structure with an inner white resin layer 46 for reflecting emission light from the LED elements 21B, 22R, 23G, and 24B toward the sealing resin 50, and an outer black resin layer 47 for preventing outward light transmission. In the light-emitting device 1, owing to the presence of the white resin layer 46, light from each LED element is reflected to the inside of the light-emitting device 1, so that the color mixing property is improved. If there is only a white resin layer 46, light may transmit through the resin frame 41, so that the light may leak outward through the side faces of the light-emitting device 1. However, since the light-emitting device 1 also includes the black resin layer 47 on the outer side of the white resin layer 46, the light hardly leaks outward and thus the light emission efficiency is improved.

The sealing resin 50 is injected inside the resin frame 41 and on the substrate 10 to cover all the LED elements 21B, 22R, 23G, and 24B in one united body for protection (encapsulation). As the sealing resin 50, for example, a colorless and transparent resin, such as an epoxy resin and a silicone resin, may be preferably used.

As depicted in FIG. 3(D), it is preferable to disperse a scattering agent 55 such as glass particles in the sealing resin 50 for diffusing emission light from the LED elements 21B, 22R, 23G, and 24B. As the scattering agent 55, for example, one containing $SiO_2$ as a main component and ground to a particle size of 5 to 8 μm is used. Alternatively, as the scattering agent 55, one containing also $SiO_2$ as a main component and having a spherical shape with a particle size of 1.5 μm may be used. By placing the sealing resin 50 containing the scattering agent 55 for diffusing the light, the light emission surface of the light outgoing port 48 is able to emit light uniformly.

The light-shielding component 61 is, for example, a resin-made sheet-formed component, and is placed such that the entire upper surface of the sealing resin 50, which is a surface of the substrate 10 opposite of the mounting surface, is covered. As depicted in FIG. 3(B), the light-shielding component 61 has preferably a two-layer structure similar to the resin frame 41 with an inner white sheet 66 for reflecting emission light from the LED elements 21B, 22R, 23G, and 24B toward the sealing resin 50, and an outer black sheet 67 for preventing outward light transmission.

In the light-emitting device 1, owing to the presence of the white sheet 66, light from each LED element is reflected to the inside of the light-emitting device 1, so that the color mixing property is improved. If there is only a white sheet 66, light may transmit through the light-shielding component 61, so that the light may leak outward through the upper surface of the light-emitting device 1. However, since the light-emitting device 1 also includes the black sheet 67 on the outer side of the white sheet 66, the light hardly leaks outward and thus the light emission efficiency is improved. The resin frame 41 and the light-shielding component 61 are not necessarily required to be two independent components, and may be one united body covering the three side surfaces and the upper surface of the light-emitting device 1.

FIG. 5(A) to FIG. 12(B) are figures illustrating production process steps for the light-emitting device 1. (A) of each figure is a perspective view with respect to each step, and (B) of each figure is a longitudinal sectional view of (A).

First, as depicted in FIG. 5(A) and FIG. 5(B), the LED elements 21B, 22R, 23G, and 24B are mounted on the upper surface of the substrate 10 in a row and in the mentioned order (Step 1). In this case, an example for producing six light-emitting devices 1 at the same time is presented, and six sets in three rows by two columns of LED elements 21B, 22R, 23G, and 24B are mounted on a substrate 10.

Next, as depicted in FIG. 6(A) and FIG. 6(B), the plurality of sets of LED elements 21B, 22R, 23G, and 24B on the substrate 10 are covered, for example, by a molding method, etc., with a sealing resin 50 into a single body (Step 2). Although the sealing resin 50 may be a plain transparent resin, a scattering agent is preferably dispersed in the sealing resin 50.

Next, as depicted in FIG. 7(A) and FIG. 7(B), grooves 56 for phosphor layers 30 are formed by performing dicing on the sealing resin 50 obtained in Step 2 (Step 3). In this case, two grooves 56 are formed for producing each of the three light-emitting devices 1 in right and left two separate rows on the substrate 10.

Further, as depicted in FIG. 8(A) and FIG. 8(B), phosphor layers 30 are formed by filling the grooves 56 formed in Step 3 with a resin containing a phosphor (Step 4).

Next, as depicted in FIG. 9(A) and FIG. 9(B), grooves 57 for a resin frame 41 is formed by performing dicing on the sealing resin 50 obtained in Step 4 (Step 5). On this occasion, all the four side surfaces of the sealing resin 50, and two grooves perpendicular to the phosphor layers 30 are cut off.

Next, as depicted in FIG. 10(A) and FIG. 10(B), the four side surfaces of the sealing resin 50 and the inside of the grooves 57 cut off in Step 5, as well as the upper surface of the sealing resin 50 are covered with a reflective white resin to form a resin frame 41 and a light-shielding component 61 (Step 6). These figures illustrate an example where the resin frame 41 and the light-shielding component 61 are formed in a single body. In this regard, it is preferable to coat further the surfaces of the white resin with a black resin in Step 6, such that the resin frame 41 and the light-shielding component 61 constitute a two-layer structure.

Further, as depicted in FIG. 11(A) and FIG. 11(B), dicing is performed on the parts (sign X) where the grooves 57 were formed and the central part of the substrate 10 perpendicular to the grooves 57 (Step 7). In doing so, six light-emitting devices 1 are completed as depicted in FIG. 12(A) and FIG. 12(B), thereby completing the production process of the light-emitting device 1.

FIG. 13(A) to FIG. 13(F) are respectively top views of light-emitting devices 1, 1A, 1B, 1C, 1D, and 1E. These figures are top views depicting a state where the light-shielding component 61 is removed.

The phosphor layer 30 may not necessarily be a wall type that divides the sealing resin 50 between the LED element 21B and the LED element 22R. For example, as the phosphor layer 30A of the light-emitting device 1A depicted in FIG. 13(B), the phosphor layer may occupy the entire space around the LED element 21B and surrounded by three side walls of the resin frame 41. Alternatively, the phosphor layer may be a hollow square-shaped wall surrounding the LED element 21B as the phosphor layer 30D of the light-emitting device 1D depicted in FIG. 13(E).

Figure 13:
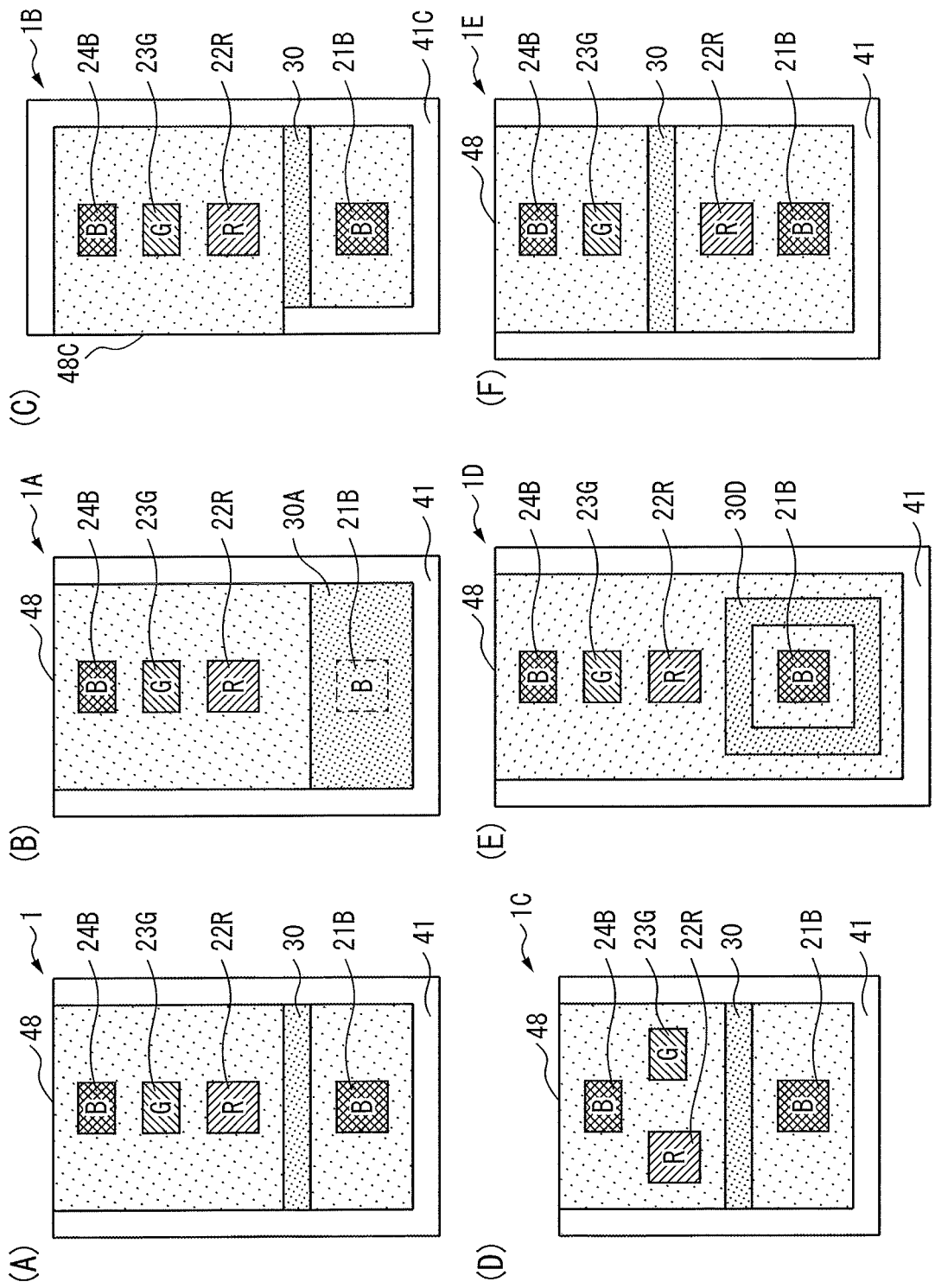
FIGS. 13(A) to (F) are top views of light-emitting devices 1, 1A, 1B, 1C, 1D, and 1E.
Figure 15:
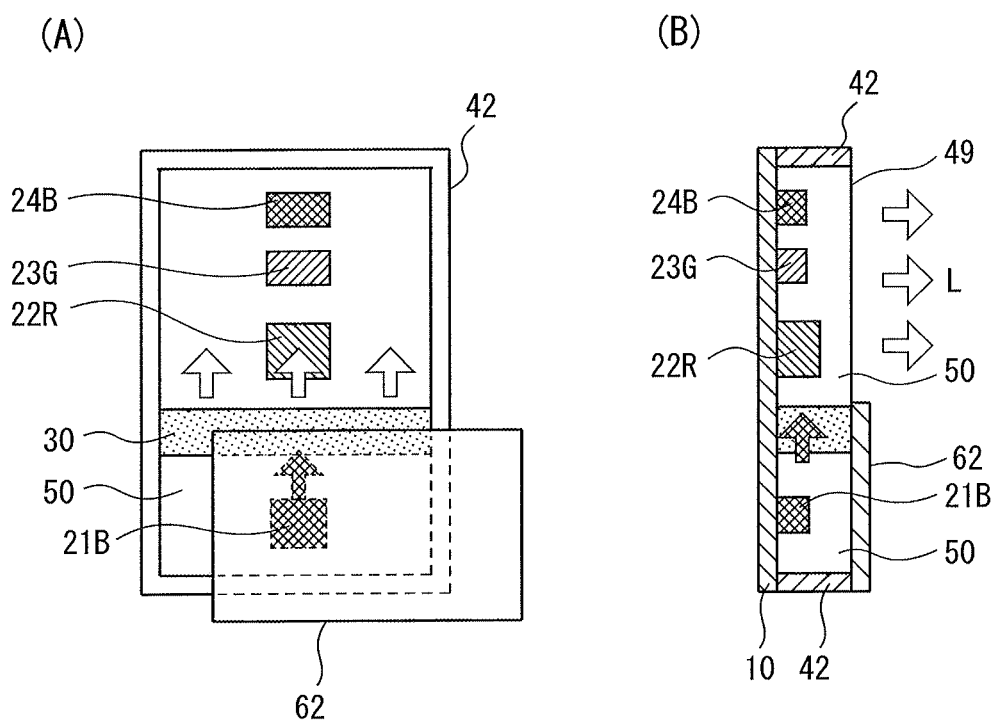
FIGS. 15(A) and (B) are figures for illustrating the structure of a light-emitting device 2.

The resin frame may have a light outgoing port 48C laterally with respect to the alignment direction of the four LED elements as the resin frame 41C of the light-emitting device 1B depicted in FIG. 13(C). In this case, the light outgoing port 48C is preferably placed only at a lateral position of the LED elements 22R, 23G, and 24B for the sake of color mixing of red light, green light, blue light, and white light. The emission light of the light-emitting device 1C is emitted from the light outgoing port 48C in a direction parallel to the mounting surface of the substrate 10 and perpendicular to the alignment direction of the four LED elements.

Further, the LED elements 22R, 23G, and 24B may be placed in a triangular form. For example, the LED elements 22R, 23G, and 24B may be mounted in the region between the light outgoing port 48 and the phosphor layer 30, and in a triangular form such that the LED element 24B is positioned most apart from the phosphor layer 30, as in the light-emitting device 1C depicted in FIG. 13(D). In the case of a triangular alignment, the distances among the elements are shorter than a case where the three LED elements are placed on a single straight line, and therefore the color mixing property is improved compared to a case where the three LED elements are placed in a row transversely with respect to the emission direction.

The LED element 22R may be placed closer to the LED element 21B than the phosphor layer 30, as in the light-emitting device 1E depicted in FIG. 13(F). Since red light does not excite the yellow phosphor in the phosphor layer 30, the LED element 22R may be placed at any position on the common mounting surface for the other LED elements 21B, 23G, and 24B.

FIG. 14(A) to FIG. 15(B) are figures for illustrating the structure of a light-emitting device 2. The light-emitting device 2 includes a substrate 10, four LED elements 21B, 22R, 23G, and 24B, a phosphor layer 30, a resin frame 42, a sealing resin 50, and a light-shielding component 62. The light-emitting device 2 is different from the light-emitting device 1 only in the shapes of the resin frame and the light-shielding component, and the light emission direction, and is constituted identically with the light-emitting device 1 in other aspects. Therefore, with respect to the light-emitting device 2, only aspects different from the light-emitting device 1 will be described below, and description duplicated with the light-emitting device 1 will be omitted.

Lateral four surfaces of the light-emitting device 2 are covered with the resin frame 42, and part of the upper surface is covered with the light-shielding component 62. An upper part not covered with the light-shielding component 62 is a light outgoing port 49 of the light-emitting device 2, from which the light-emitting device 2 emits light as indicated by arrows L in FIG. 15(B). The light-emitting device 2 is a top-emission-type LED package applicable to an illumination light source, or a backlight light source.

FIG. 14(A) is a perspective view depicting the light-emitting device 1 attached with the resin frame 42 and the light-shielding component 62, and FIG. 14(B) is a longitudinal sectional view of FIG. 14(A). FIG. 14(C) is a perspective view depicting the light-emitting device 2 from which the resin frame 42 and the light-shielding component 62 are removed, and FIG. 14(D) is a longitudinal sectional view of FIG. 14(C). FIG. 15(A) is a top view of the light-emitting device 2 from which the light-shielding component 62 is removed, and FIG. 15(B) is a longitudinal sectional view of FIG. 15(A).

The resin frame 42 is a resin-made component that surrounds entirely four sides of the outer circumference of the substrate 10. Also in the light-emitting device 2, as depicted in FIG. 14(B), the resin frame 42 has preferably a two-layer structure with an inner white resin layer 46 for reflecting emission light from the LED elements 21B, 22R, 23G, and 24B toward the sealing resin 50, and an outer black resin layer 47 for preventing outward light transmission. The white resin layer 46 improves the color mixing property, and further the black resin layer 47 on the outer side of the white resin layer 46 makes the light hardly leak outward and improves the light emission efficiency.

The light-shielding component 62 is, for example, a resin-made sheet-formed component, which is placed on about a half of upper surface of the sealing resin 50 so as to cover only the area over the LED element 21B. The light-emitting device 2 has the light outgoing port 49 over the LED elements 22R, 23G, and 24B, and the emission light from the LED elements 21B, 22R, 23G, and 24B is emitted from the light outgoing port 49 in the direction perpendicular to the mounting surface of the substrate 10. Also in the light-emitting device 2, as depicted in FIG. 14(B), the light-shielding component 62 has preferably a two-layer structure with an inner white sheet 66 for reflecting mainly emission light from the LED element 21B toward the sealing resin 50, and an outer black sheet 67 for preventing outward light transmission. The white sheet 66 improves the color mixing property, and further the black sheet 67 on the outer side of the white sheet 66 makes the light hardly leak outward and improves the light emission efficiency.

FIG. 16(A) to FIG. 16(E) are respectively top views of light-emitting devices 2, 2A, 2C, 2D, and 2E. These figures are top views depicting a state where the light-shielding component 62 is removed.

Also in the top-emission-type light-emitting device 2, the phosphor layer 30 may not necessarily be a wall type that divides the sealing resin 50 between the LED element 21B and the LED element 22R. For example, as the phosphor layer 30A of the light-emitting device 2A depicted in FIG. 16(B), the phosphor layer may occupy the entire space around the LED element 21B and surrounded by three side walls of the resin frame 42. Alternatively, the phosphor layer may be a hollow square-shaped wall surrounding the LED element 21B as the phosphor layer 30D of the light-emitting device 2D depicted in FIG. 16(D).

Further, the LED elements 22R, 23G, and 24B may be placed in a triangular form. For example, the LED elements 22R, 23G, and 24B may be mounted in the region on the side opposite of the LED element 21B with respect to the phosphor layer 30 and in a triangular form such that the LED element 24B is positioned most apart from the phosphor layer 30, as in the light-emitting device 2C depicted in FIG. 16(C).

Figure 16:
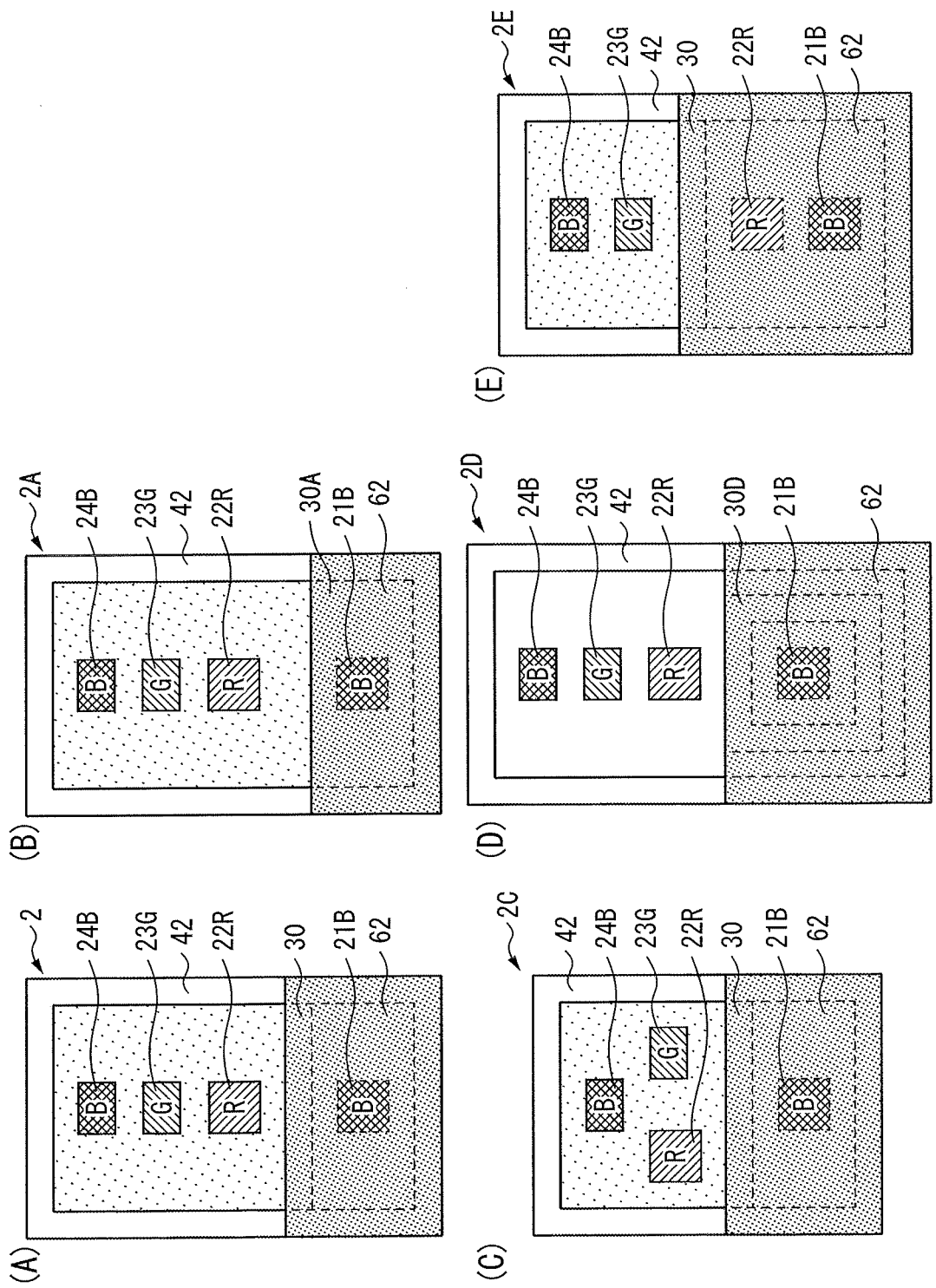
FIGS. 16(A) to (E) are top views of light-emitting devices 2, 2A, 2C, 2D, and 2E.

The LED element 22R may be placed closer to the LED element 21B than the phosphor layer 30, as in the light-emitting device 2E depicted in FIG. 16(E). Since red light does not excite the yellow phosphor in the phosphor layer 30, the LED element 22R may be placed at any position on the common mounting surface for the other LED elements 21B, 23G, and 24B.

Figure 17:
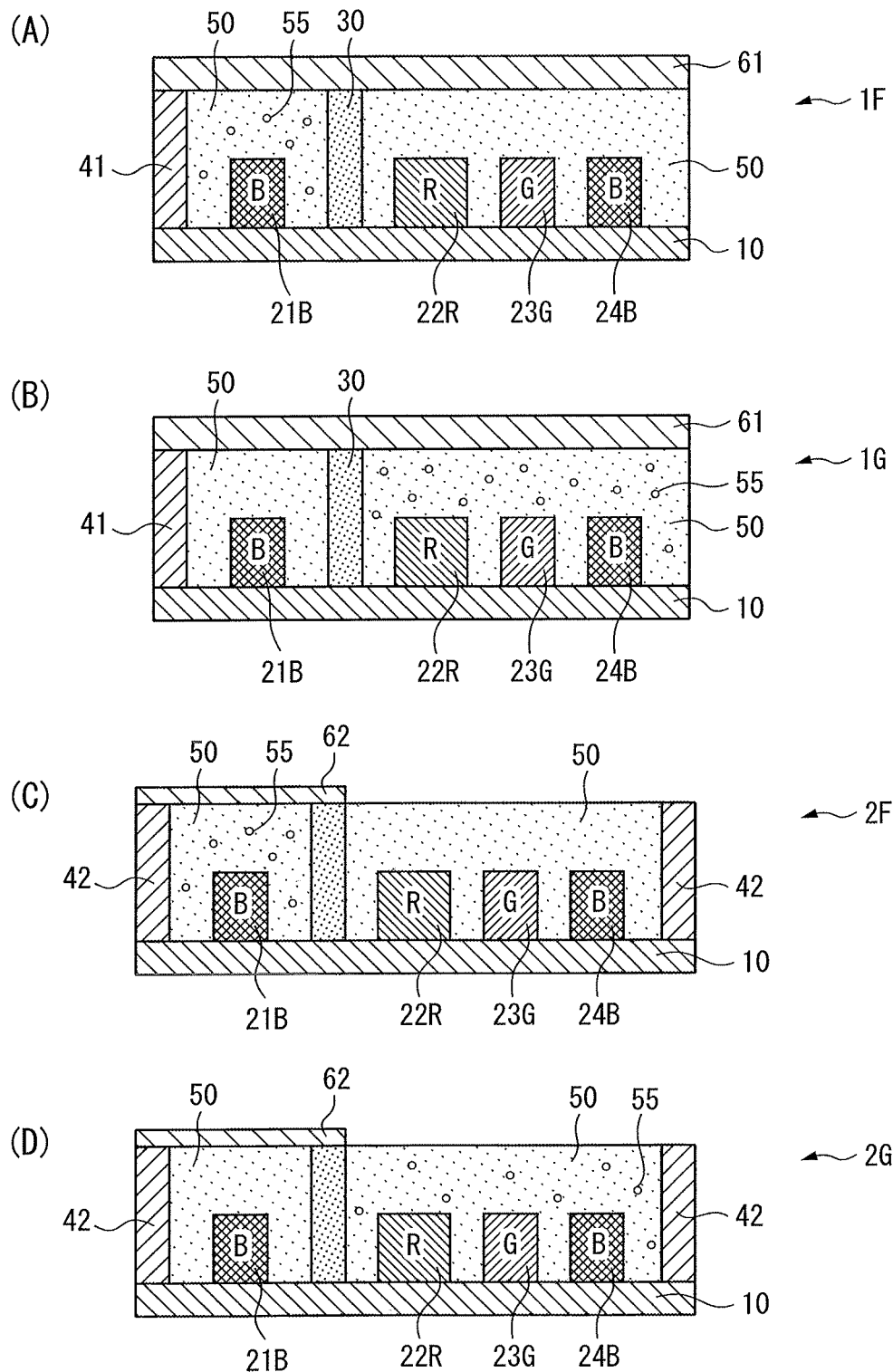
FIGS. 17(A) to (D) are top views of other light-emitting devices 1F, 1G, 2F, and 2G.

FIG. 17(A) to FIG. 17(D) are respectively top views of other light-emitting devices 1F, 1G, 2F, and 2G. These figures are longitudinal sectional views equivalent to FIG. 3(B) or FIG. 14(B). The light-emitting devices 1F, 1G, 2F, and 2G are constituted identically with the light-emitting devices 1, 2 except in terms of existence or nonexistence of the scattering agent 55 in the sealing resin 50. When the scattering agent 55 is dispersed in the sealing resin 50, the color mixing property is improved. The scattering agent 55 may be blended uniformly with the entire sealing resin 50, or blended with only part of the sealing resin 50. For example, as depicted in FIG. 17(A) and FIG. 17(C), the scattering agent 55 may be blended only with a portion in the vicinity of the LED element 21B out of the sealing resin 50 which is divided with the phosphor layer 30. Alternatively, as depicted in FIG. 17(B) and FIG. 17(D), the scattering agent 55 may be blended only with a portion in the vicinity of the LED elements 22R, 23G, and 24B out of the sealing resin 50.

Further, although not illustrated, a resin frame which is, for example, colorless and transparent and contains a scattering agent may be provided only near the light emission surface with the light outgoing port 48, 49, in either of the side-emission-type light-emitting device 1, or the top-emission-type light-emitting device 2. Even when the scattering agent is provided only near the light emission surface in this manner, the color mixing property is improved.

Although the whole body of any of the above light-emitting devices has a rectangular shape, for example, the corners of the resin frames 41, 42 may have a tapered shape, or a rounded shape. It is also possible to improve the light emission efficiency by such shape modification. The whole body shape of the light-emitting device may be changed appropriately corresponding to an intended use.

Figure 18:
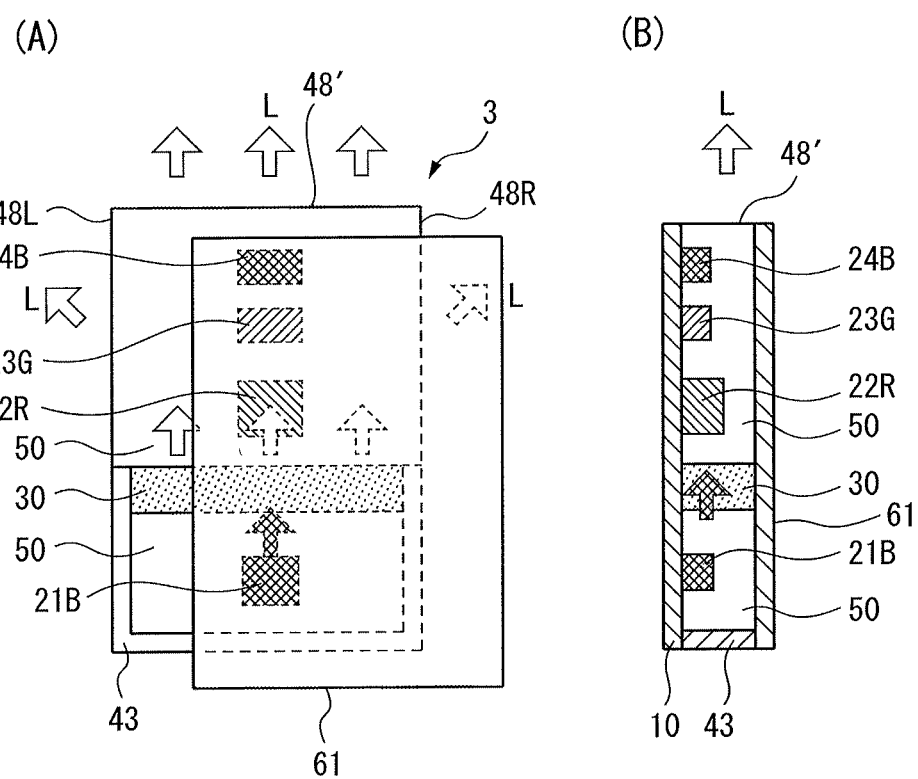
FIGS. 18(A) and (B) are figures for illustrating the structure of a light-emitting device 3.

FIG. 18(A) and FIG. 18(B) are figures for illustrating the structure of a light-emitting device 3. FIG. 18(A) is a top view of the light-emitting device 3 equivalent to FIG. 4(A) and FIG. 15(A), and FIG. 18(B) is a longitudinal sectional view of FIG. 18(A).

The light-emitting device 3 includes a substrate 10, four LED elements 21B, 22R, 23G, and 24B, a phosphor layer 30, a resin frame 43, a sealing resin 50, and a light-shielding component 61. The light-emitting device 3 is different from the light-emitting device 1 only in the shape of the resin frame and the light emission direction, and is constituted identically with the light-emitting device 1 in other aspects. Therefore, also with respect to the light-emitting device 3, only aspects different from the light-emitting device 1 will be described, and description duplicated with the light-emitting device 1 will be omitted.

In the light-emitting device 3, the resin frame 43 surrounds the outer circumference of the substrate 10 only in an approximately half area thereof where the LED element 21B is mounted. In the other half where the LED elements 22R, 23G, and 24B are mounted, the resin frame 43 is not provided on the substrate 10. Also in the light-emitting device 3, the light-shielding component 61 covers the entire upper surface of the sealing resin 50, identically with the light-emitting device 1. Therefore, in the light-emitting device 3, a side surface 48' located frontwards in the alignment direction of the LED elements, and regions 48L, 48R of the side surfaces which are not covered with the resin frame 43 and located laterally with respect to the alignment direction of the LED elements function as a light outgoing port. The light-emitting device 3 emits light in three directions from the side surface 48' and the regions 48L, 48R as indicated by arrows L in FIG. 18(A). The light-emitting device 3 is a three-face side-emission-type LED package applicable to an illumination light source, or a backlight light source.

The light emission direction from the light-emitting device is not limited to one direction from a side surface or top surface as in the case of light-emitting device 1, 2, rather it may be more than one direction as in the case of light-emitting device 3. Further, although not illustrated, by covering one of the regions 48L, 48R with a resin frame, the light emission directions of the light-emitting device may be limited to two directions of the side surface 48', and the region 48L or the region 48R. For example, also in the light-emitting devices 1A to 1E depicted in FIG. 13(B) to FIG. 13(F), by removing both a front part in the alignment direction of the LED elements 21B, 22R, 23G, and 24B, and a lateral part with respect to the LED elements 22R, 23G, and 24B of the resin frame 41, 41C, light emission in more than one direction may be made possible. Alternatively, also in the light-emitting devices 2, 2A, and 2C to 2E depicted in FIG. 16(A) to FIG. 16(E), for example, a front part in the alignment direction of the LED elements 21B, 22R, 23G, and 24B of the resin frame 42 may be removed such that light emission in two directions, namely lateral and upward directions, is possible.

The respective light-emitting devices described above have the LED elements 22R, 23G, and 24B which are LED elements for red, green and blue, in the light emission path of the LED element 21B which emits white light. By this means, in the light-emitting devices, the color rendering property may be improved and the hue of white light can be adjusted easily. Further, in each of the above light-emitting devices, among the LED elements 22R, 23G, and 24B, the LED elements 23G, 24B are outside the phosphor layer, and especially the LED element 24B, which is able to excite the phosphor, is located at the most distant position from the phosphor layer 30. Owing to this arrangement, light emission of the LED elements 23G, 24B is not inhibited by the phosphor, and the phosphor is hardly excited by the LED element 24B. Therefore, excitation light is not any more generated unnecessarily, even when the LED elements 21B, 24B are activated to emit light simultaneously.

When LED elements for red, green, and blue are placed in a row transversely with respect to the emission direction, the color mixing property may be occasionally deteriorated by an influence of directivity. However, in any of the above light-emitting devices, by arranging the LED elements 22R, 23G, and 24B in a row along the emission direction, or in a triangular form, the color mixing property is improved. Further, in any of the above light-emitting devices, owing to the presence of the resin frame 41, 42, or 43, and the light-shielding component 61, 62, light leaking from an area other than the light outgoing port 48, 49 is decreased, and therefore the light emission efficiency is also improved.

The invention claimed is:

1. A light-emitting device comprising:
 a phosphor layer containing a phosphor;
 a first LED element to emit white light in combination with fluorescence generated by excitation of the phosphor;
 a second LED element to emit red light;
 a third LED element to emit green light placed on a side opposite of the first LED element with respect to the phosphor layer;
 a fourth LED element to emit blue light placed on the side opposite of the first LED element with respect to the phosphor layer, the fourth LED element being placed more distant from the phosphor layer compared to the second and the third LED elements;
 a substrate with the first to the fourth LED elements mounted on a common mounting surface,
 wherein the first LED and the phosphor layer are positioned to emit the white light towards the second LED, the third LED and the fourth LED;
 a resin frame surrounding at least a part of an outer circumference of the substrate;
 a sealing resin injected inside the resin frame and on the substrate to encapsulate the first to the fourth LED elements; and
 a light-shielding component placed on an upper surface of the sealing resin, which is a surface opposite of the mounting surface, to cover at least an upper surface of the first LED element, wherein the light-shielding component covers the entire upper surface of the sealing resin wherein the resin frame has a light outgoing port for emission light from the first to the fourth LED elements, and wherein the emission light is emitted from the light outgoing port in a direction parallel to the mounting surface.

2. The light-emitting device according to claim 1, wherein a scattering agent for diffusing light is dispersed in the sealing resin.

3. The light-emitting device according to claim 1, wherein the resin frame comprises an inner white resin layer for reflecting light toward the sealing resin, and an outer black resin layer for preventing outward light transmission.

4. The light-emitting device according to claim 1, wherein the light-shielding component comprises an inner white sheet for reflecting light toward the sealing resin, and an outer black sheet for preventing outward light transmission.

5. The light-emitting device according to claim 1, wherein the first to the fourth LED elements are aligned on the mounting surface in a row and in the mentioned order.

6. The light-emitting device according to claim 5, wherein
 the phosphor layer divides the sealing resin between the third LED element and the second LED element, and
 the second LED element is placed closer to the first LED element than the phosphor layer.

7. The light-emitting device according to claim 1, wherein the second to the fourth LED elements are aligned in a triangular form.

8. The light-emitting device according to claim 1, wherein
 the third and the fourth LED elements are transparent elements allowing the white light and the red light to transmit, and
 the second LED element is an opaque element not allowing the blue light to transmit.

* * * * *